United States Patent

Shioyama et al.

Patent Number: 5,731,601
Date of Patent: Mar. 24, 1998

[54] FOUR-PHASE DRIVING CCD SOLID-STATE IMAGING DEVICE WITH A TWO-LAYER TRANSFER GATE ELECTRODE

[75] Inventors: Yoshiyuki Shioyama; Hidenori Shibata, both of Kawasaki, Japan

[73] Assignee: Kabushiki Kaisha Toshiba, Kawasaki, Japan

[21] Appl. No.: 769,380

[22] Filed: Dec. 19, 1996

[30] Foreign Application Priority Data

Dec. 20, 1995 [JP] Japan .................. 7-332025

[51] Int. Cl.$^6$ .................. H01L 27/148; H01L 29/768
[52] U.S. Cl. .................. 257/233; 257/246; 257/250
[58] Field of Search .................. 257/233, 246, 257/250

[56] References Cited

U.S. PATENT DOCUMENTS

| 4,847,692 | 7/1989 | Tabei | 257/233 |
| 5,210,433 | 5/1993 | Ohsawa et al. | 257/233 |
| 5,428,231 | 6/1995 | Tanaka et al. | 257/233 |
| 5,614,741 | 3/1997 | Harada et al. | 257/233 |

*Primary Examiner*—Gene M. Munson
*Attorney, Agent, or Firm*—Finnegan, Henderson, Farabow, Garrett & Dunner, L.L.P.

[57] ABSTRACT

According to the present invention, there is provided a solid-state imaging device that has a two-layer transfer electrode structure and is based on a four-phase driving all-pixel reading scheme. The transfer gate electrodes for taking the signal charges out of the photodiode PD and transferring them vertically are formed so that the polysilicon electrodes of a first layer and the polysilicon electrodes of a second layer may each have a specific gate length and be in contact with the gate insulating film on a silicon substrate. If four-phase transfer clocks are φ1 to φ4, the clocks will be applied to the transfer gate electrodes 31, 32 repeatedly in this order for a single pixel (photodiode PD): the second-layer electrode (φ2)—the second-layer electrode (φ3)—the first-layer electrode (φ4)—the first-layer electrode (φ1).

9 Claims, 15 Drawing Sheets

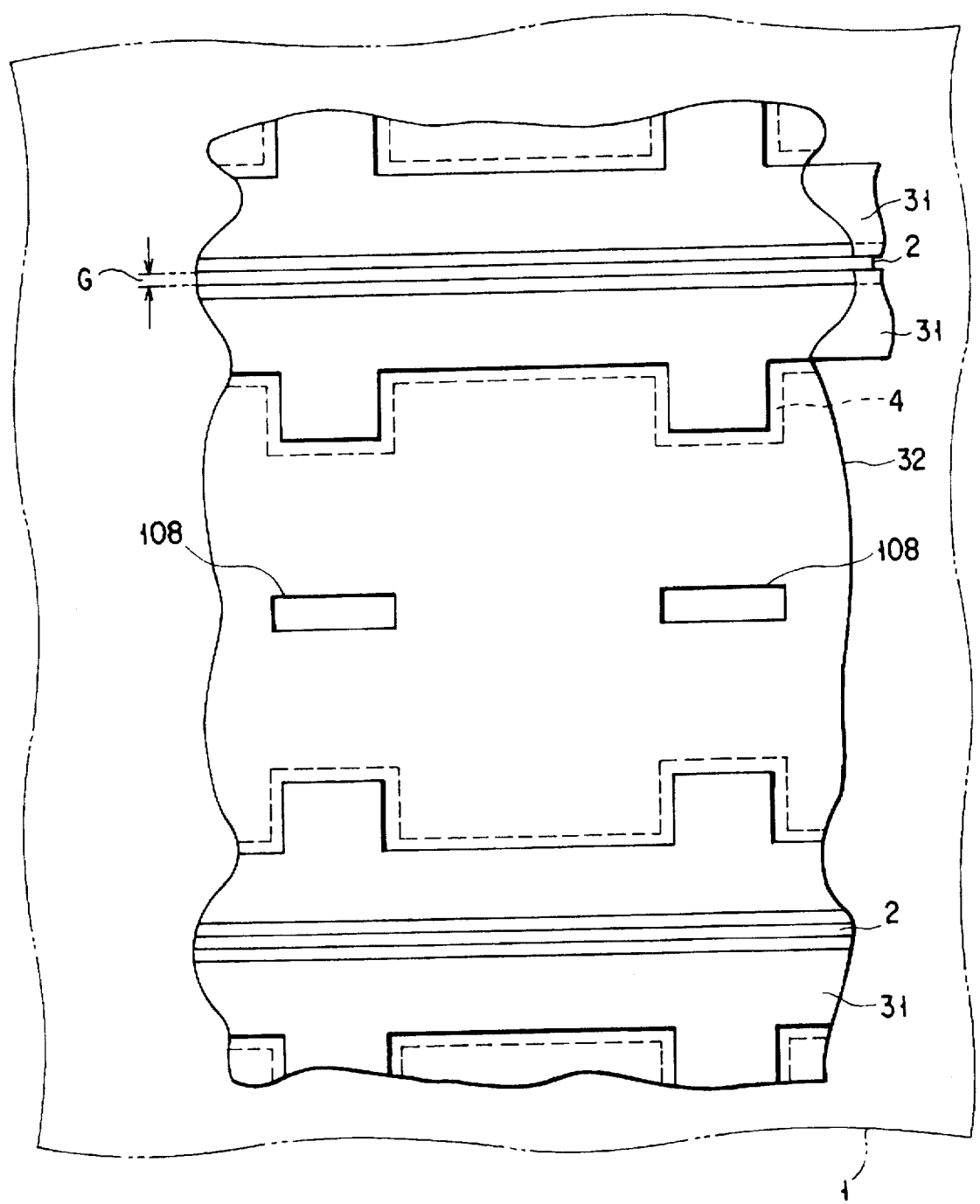
F I G. 11

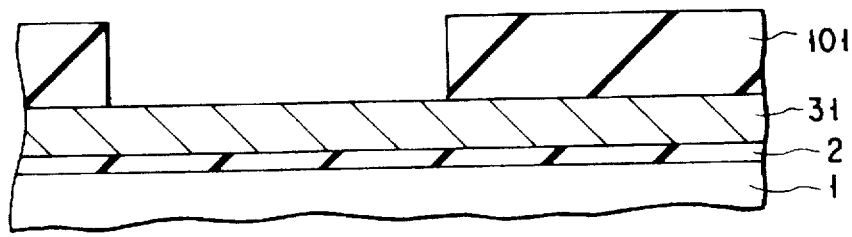
F I G. 14
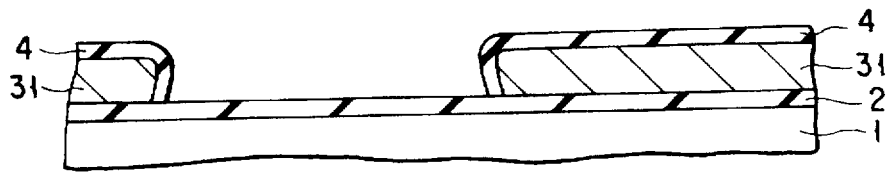
F I G. 15
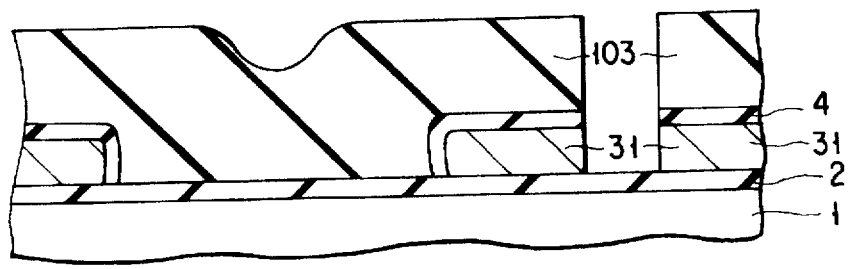
F I G. 16
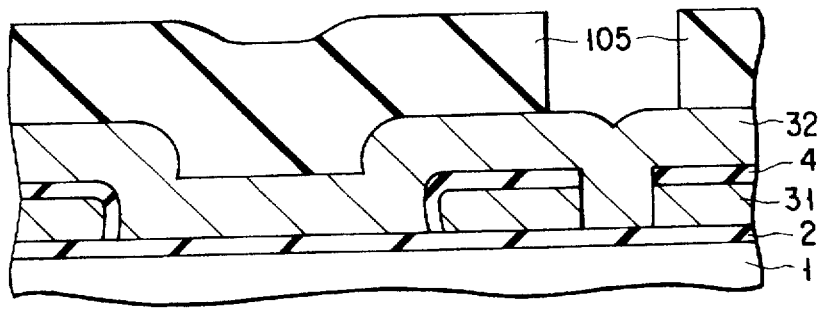
F I G. 17
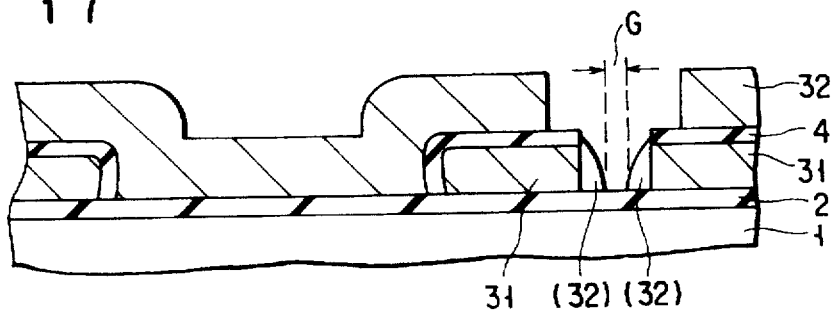
F I G. 18

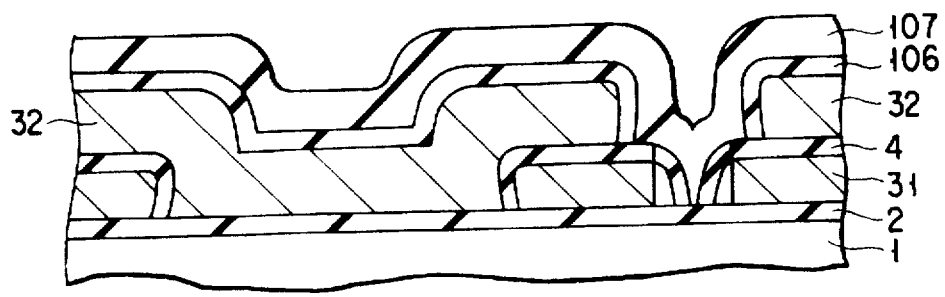
F I G. 19
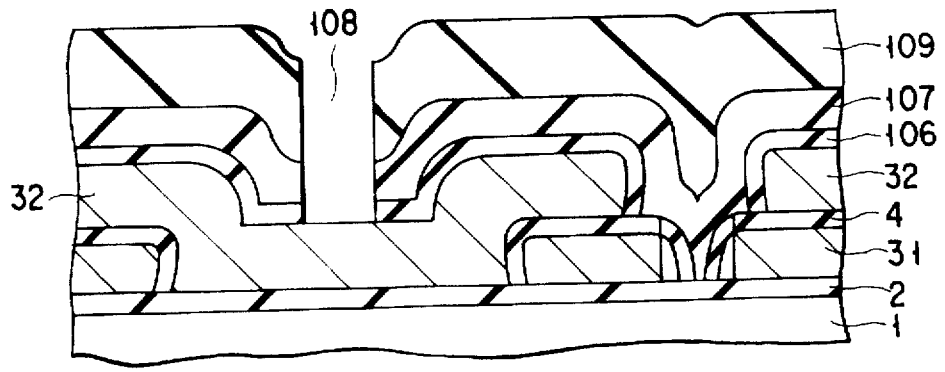
F I G. 20
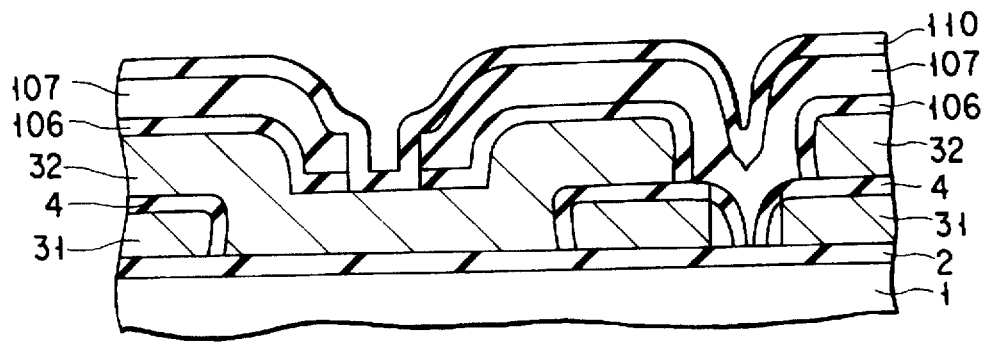
F I G. 21
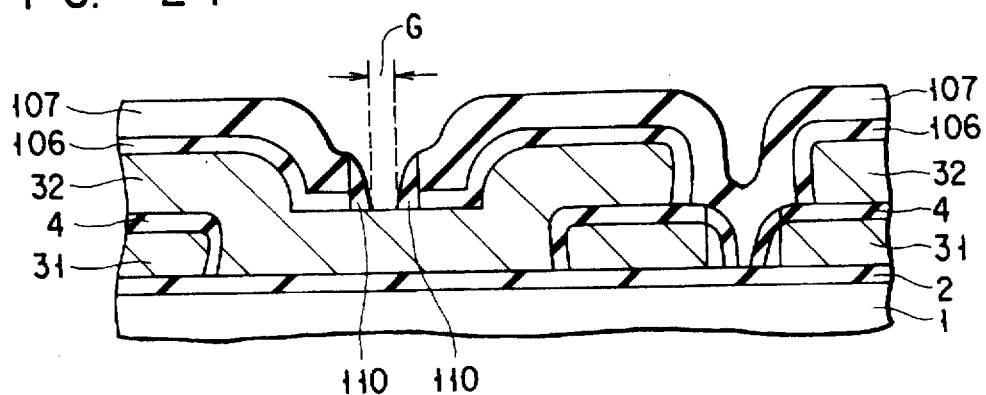
F I G. 22

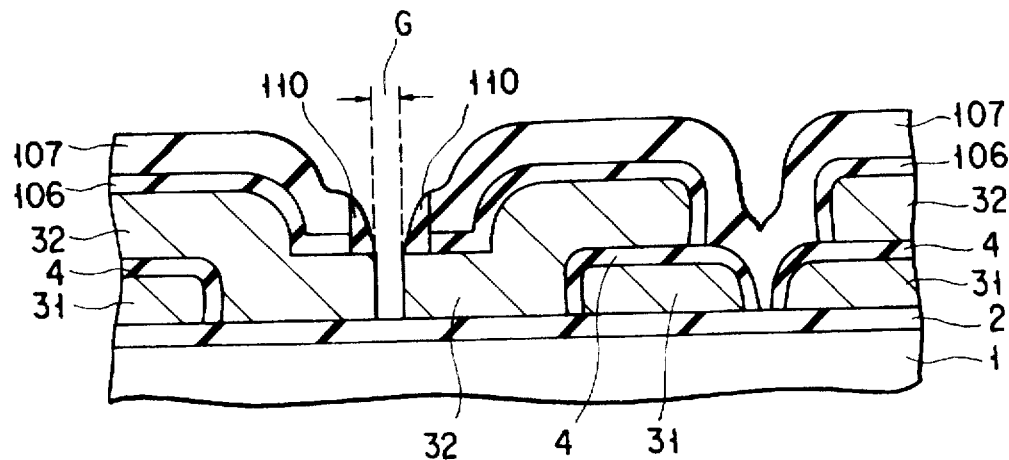
F I G. 23
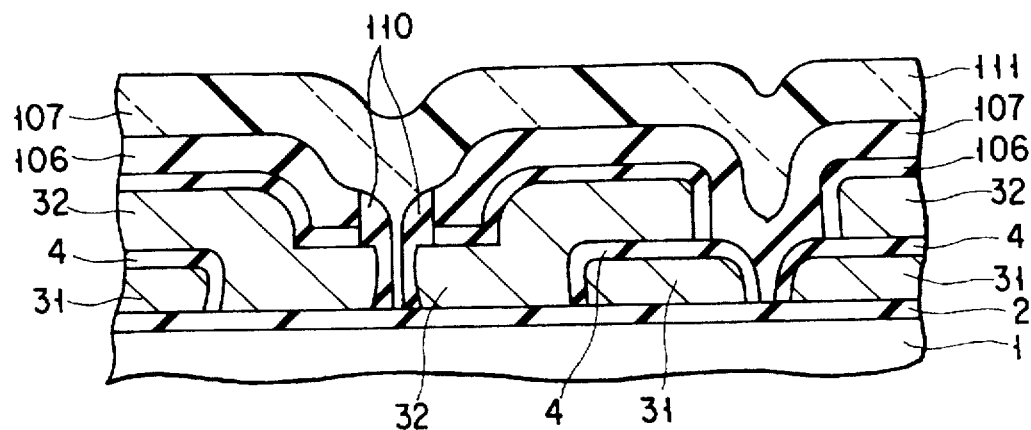
F I G. 24

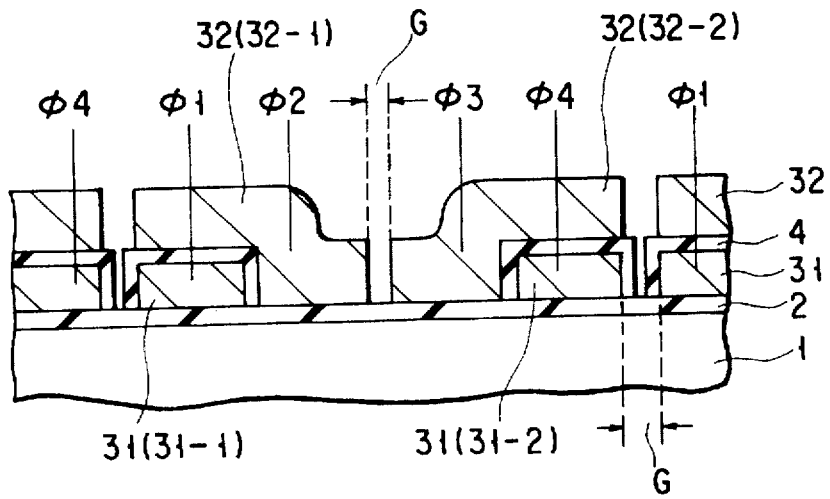
F I G. 26
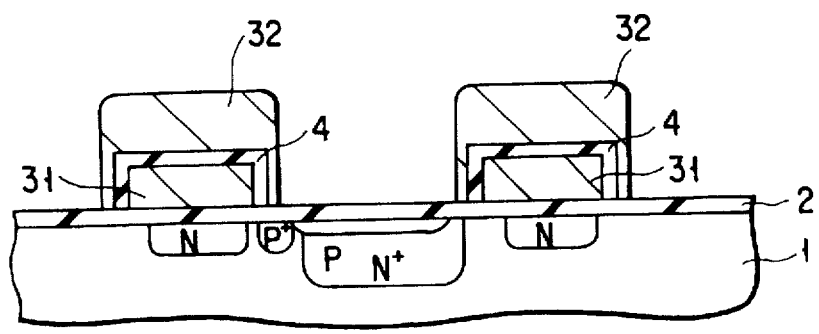
F I G. 27

FOUR-PHASE DRIVING CCD SOLID-STATE IMAGING DEVICE WITH A TWO-LAYER TRANSFER GATE ELECTRODE

BACKGROUND OF THE INVENTION

This invention relates to a solid-state imaging device and a manufacturing method thereof, and more particularly to the electrode structure of a two-dimensional area sensor for four-phase driving all-pixel reading and a manufacturing method thereof.

With conventional solid-state imaging devices used for civilian movies, interlacing has been effected to form a single frame in 1/30 second in a manner that images an even field in the first 1/60 second and an odd field in the latter 1/60 second. The reason for this is that they have been designed to match the imaging operation of currently popularized television sets.

On the other hand, for computer terminals (displays), a non-interlacing scheme has been widely used which forms a single frame in 1/60 second by scanning the electric signal from the computer sequentially on the display without dividing one frame into an even field and an odd field, which is different from the interlacing operation.

The non-interlacing scheme is characterized by providing flicker-free sharp pictures since the imaging interval of one frame is short as compared with the interlacing scheme and one frame is imaged in one field.

To achieve the non-interlacing scheme having such a feature, a four-phase driving solid-state imaging device that reads all the pixels. For instance, four-phase driving CCDs that perform an all-pixel reading operation are expected not only to be used as computer image input devices for computers but also find their way into the fields where relatively high-quality picture inputs are required, such as broadcasting cameras.

To construct an interline transfer CCD (hereinafter, abbreviated as IT-CCD) so as to read all the pixels by four-phase driving, however, it has been necessary to modify the configuration of the imaging device so that the device may agree with the operation of the non-interlacing scheme. Hereinafter, this will be explained.

When the conventional IT-CCD is operated by the interlacing scheme, the transfer of signal charges after the signal charges accumulated in a single pixel have been taken out is achieved by repeating the transfer on the second-layer electrode, the first-layer electrode, the second-layer electrode, and the first-layer electrode, in that order according to a four-phase transfer clock. That is, from the viewpoint of the four-phase clock, the interlacing is done in such a manner that the transfer operation is carried out, extending over two pixels. In this way, with the IT-CCD, the repetitive structure of pairs of the first-layer and second-layer polysilicon electrodes has enabled the signal charges in a single pixel to be read out.

In contrast, in order to construct an all-pixel reading four-phase driving CCD for non-interlacing operation, four different pulses must be applied simultaneously to take the signal charges out of a single pixel.

FIG. 1 is a plan view of a conventional solid-state imaging device applied to a CCD that reads all pixels by a four-phase driving scheme. FIG. 2 is a sectional view of the stacked structure of a transfer gate taken along line F2 to F2 of FIG. 1. FIG. 3 is a sectional view of the stacked structure of the transfer gate taken along line F3 to F3 in FIG. 1.

In each of the figures, the transfer gate electrode for taking signal charges out of a photodiode PD and transferring them vertically is constructed as follows. The polysilicon electrodes 131, 132, 133 of a first layer (thin dotted line), a second layer (broken line), and a third layer (solid line) respectively, are formed so as to be in contact with a gate oxide film 12 on a silicon substrate 11 in such a manner that each electrode has a specific gate length. These electrodes are insulated from each other by an oxide film 14.

Four-phase transfer clocks are assumed to be $\phi1$ to $\phi4$. With a single pixel (photodiode PD), the signal charges are transferred sequentially by operating the second-layer electrode 132 ($\phi2$), the third-layer electrode 133 ($\phi3$), the second-layer electrode 132 ($\phi4$), and the first-layer electrode 131 ($\phi1$) in that order repeatedly.

Because such a four-phase driving all-pixel reading imaging device, however, requires the repetition of a structure consisting of a set of the first-layer, second-layer, third-layer, and second-layer polysilicon electrodes, the interconnections formed between adjacent photodiodes in the vertical transfer direction take the form of a stacked structure of three-layer polysilicon via an interlayer insulating film.

Such a structure causes the following problem: a shading film deposited on the stacked structure of three-layer polysilicon via the interlayer insulating film after the formation of the gate and interconnections has a break in the step portion, degrading the smear characteristic.

Furthermore, with the IT-CCD, when a structure based on the interlacing scheme is compared with a structure based on the non-interlacing scheme, the step of forming electrodes and interconnections at the transfer gates is added in the non-interlacing scheme because a four-phase driving CCD must be composed of a three-layer polysilicon stacked structure, although a four-phase driving CCD is composed of two-layer polysilicon in the interlacing scheme. The increase in the number of step raises the manufacturing cost of the device.

As described above, with the conventional four-phase driving all-pixel reading imaging device, the transfer electrode has a three-layer polysilicon stacked structure, and the shading film deposited on the stacked structure has a break in the step, introducing the danger of degrading the smear characteristic. Because of the stacked structure, the number of manufacturing processes increases, resulting in a rise in the cost.

BRIEF SUMMARY OF THE INVENTION

The object of the present invention is to provide a solid-state imaging device for reading all pixels by a four-phase driving scheme with a two-layer transfer electrode structure similar to a conventional IT-scheme CCD and a manufacturing method thereof.

The foregoing object is accomplished by providing a four-phase driving CCD-structure solid-state imaging device comprising: a semiconductor substrate; a first insulating film on the semiconductor substrate; a first-layer electrode member on the insulating film, the member serving as at least a transfer gate electrode; a second-layer electrode member on the insulating film, the member serving as at least a transfer gate electrode; and a second insulating film between the first-layer electrode member and the second-layer electrode member, wherein the CCD structure forms a vertical transfer gate electrode structure through a repetitive arrangement of the first-layer electrode member, the second-layer electrode member, the second-layer electrode member, and the first-layer electrode member in that order insulated from each other on the first insulating film.

The foregoing object is also accomplished by providing a method of manufacturing four-phase driving CCD solid-state imaging devices with two-layer transfer gate electrodes, comprising: the step of forming a gate insulating film on a semiconductor substrate; the step of depositing a first conducting layer on the gate insulating film; the photolithography step of removing, by anisotropic etching, a first area of the first conducting layer to make a photodiode and a second area in which the conducting layer of a second layer is formed; the step of forming an insulating film covering the first conducting layer; the step of forming a first opening pattern with a pitch larger than 300 nm using a photoresist in a gap forming place for separating a gate electrode from the first conducting layer and cutting off the first conducting layer by anisotropic etching; the step of depositing a second conducting layer on the first conducting layer so as to fill the second area and the cut-off portion of the first conducting layer; the step of forming a second opening pattern larger than the first opening pattern using a photoresist, centered on the cut-off portion of the first conducting layer, and making a gap smaller than 300 nm which is for separating a first and second gate electrodes from the first conducting layer by performing anisotropic etching so that the second conducting layer exposed in the second opening pattern may be left only on the sidewall of the cross section of the first conducting layer; the step of depositing a first CVD film after the surface of the second conducting layer has been oxidized; the step of forming a third opening pattern with a pitch larger than 300 nm using a photoresist in a gap forming place for separating a gate electrode from the second conducting layer and removing only the first CVD film and oxide film exposed in the third opening pattern by anisotropic etching that allows a selection ratio for the second conducting layer; the step of depositing a second CVD film thinner than the first CVD film on the etching portion with the third opening pattern and on the first CVD film; the step of forming a mask for forming a gap for separating a gate electrode from the second conducting layer by performing the anisotropic etching of the second CVD film and leaving the second CVD film as a sidewall in the etching portion with the third opening pattern; and the step of making a gap smaller than 300 which is for separating a third and fourth gate electrodes from the second conducting layer by performing anisotropic etching with the first and second CVD films as a mask and removing the exposed second conducting layer.

With the present invention, by mixing the structure of polysilicon electrodes of the same layer with the structure of polysilicon electrodes of a different layer to form the transfer gates, the step height in interconnections is reduced without decreasing the interconnection density.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is a fifth plan view following FIG. 10;

FIG. 14 is a first sectional view taken along line F14—F14 of FIG. 4, illustrating a method of manufacturing the important portion of a transfer gate electrode;

FIG. 15 is a second sectional view following FIG. 14;

FIG. 16 is a third sectional view following FIG. 15;

FIG. 17 is a fourth sectional view following FIG. 16;

FIG. 18 is a fifth sectional view following FIG. 17;

FIG. 19 is a sixth sectional view following FIG. 18;

FIG. 20 is a seventh sectional view following FIG. 19;

FIG. 21 is an eighth sectional view following FIG. 20;

FIG. 22 is a ninth sectional view following FIG. 21;

FIG. 23 is a tenth sectional view following FIG. 22;

FIG. 24 is an eleventh sectional view following FIG. 23;

FIG. 26 is a sectional view of the stacked structure of a transfer gate electrode taken along line F26—F26 of FIG. 25; and FIG. 27 is a sectional view of the stacked structure of the transfer gate electrode taken along line F27—F27 of FIG. 25.

DETAILED DESCRIPTION OF THE INVENTION

Figure 1:
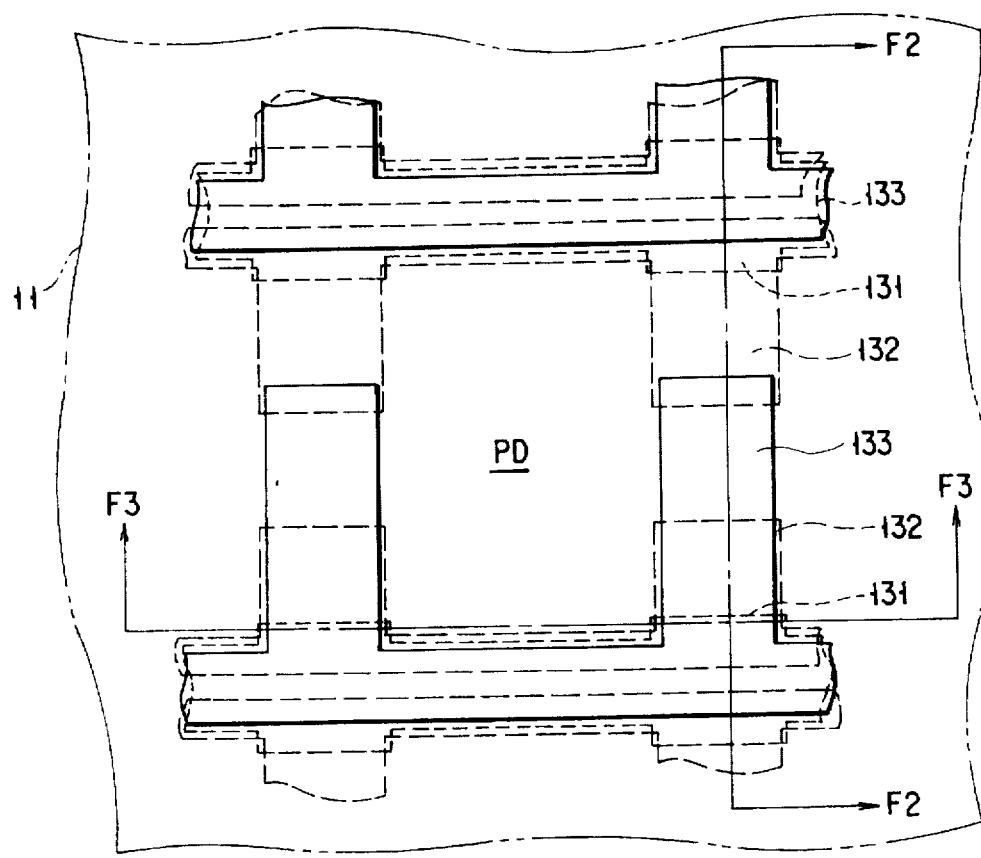
FIG. 1 is a plan view of a conventional solid-state imaging device applied to a CCD that performs an all-pixel reading operation by a four-phase driving scheme.
Figure 2:
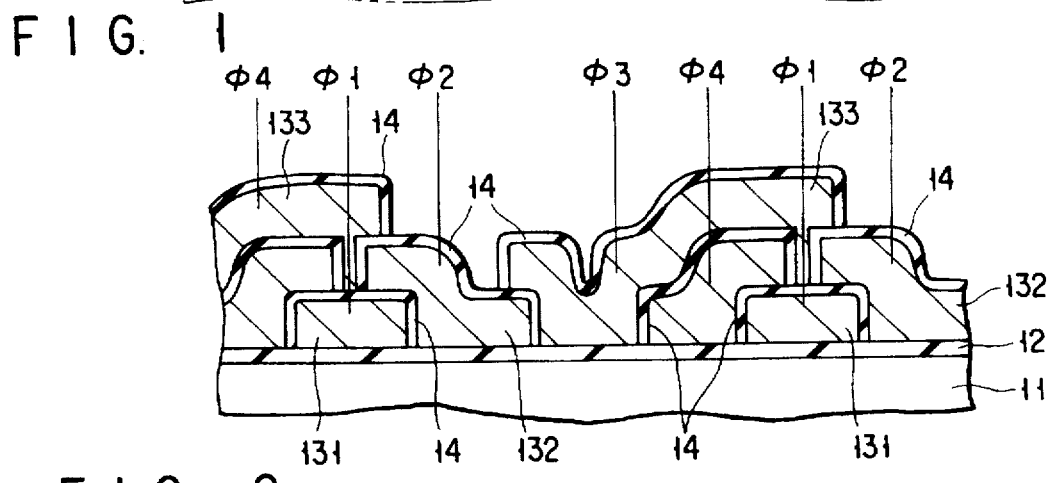
FIG. 2 is a sectional view of the stacked structure of a transfer gate electrode taken along line F2—F2 of FIG. 1.
Figure 3:
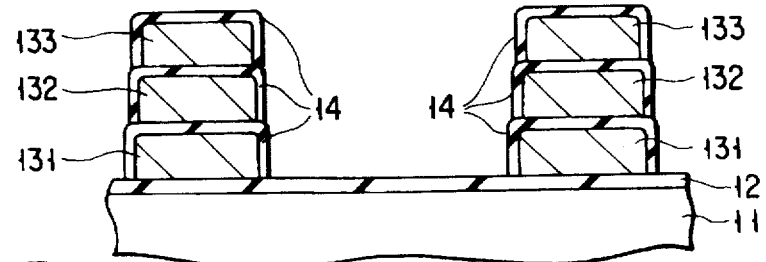
FIG. 3 is a sectional view of the stacked structure of the transfer gate electrode taken along line F3—F3 of FIG. 1.
Figure 4:
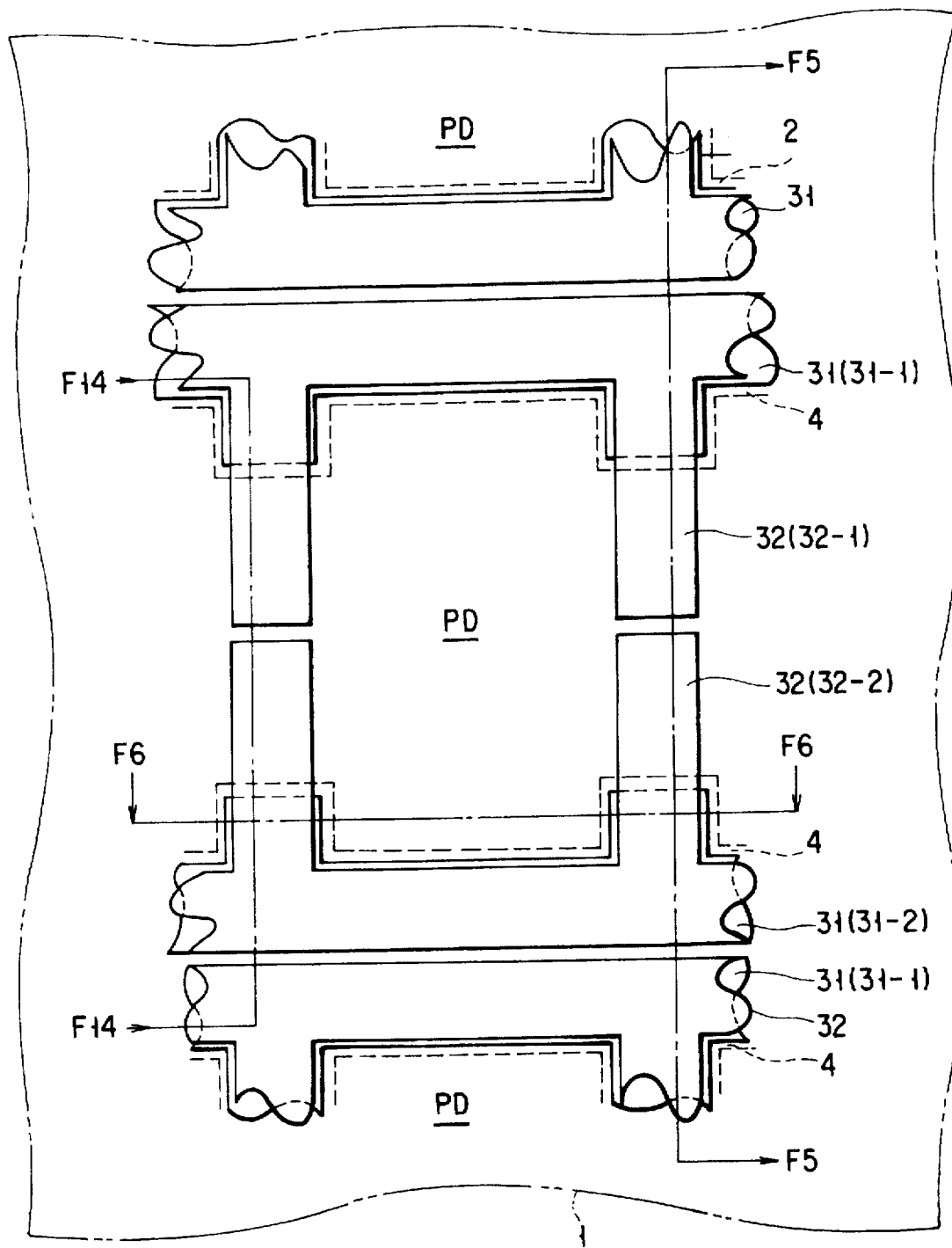
FIG. 4 is a plan view of a solid-state imaging device having a CCD structure that performs an all-pixel reading operation by a four-phase driving scheme, according to a first embodiment of the present invention.
Figure 5:
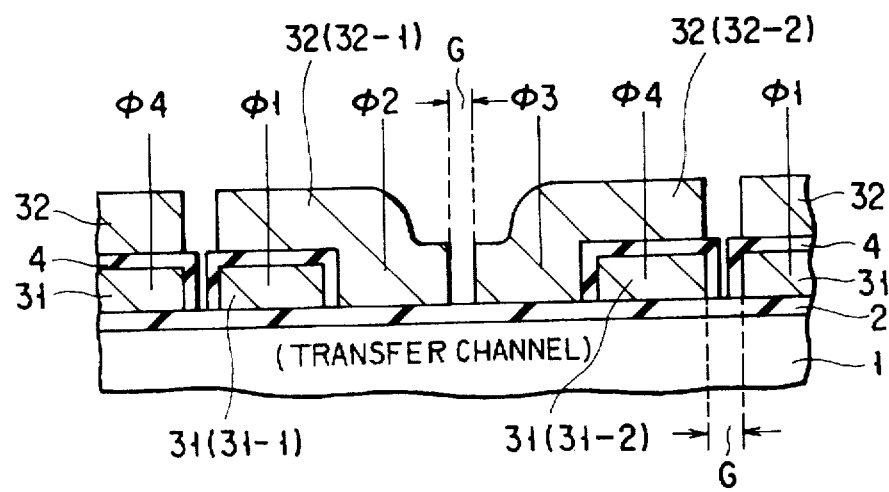
FIG. 5 is a sectional view of the stacked structure of a transfer gate electrode taken along line F5—F5 of FIG. 4.
Figure 6:
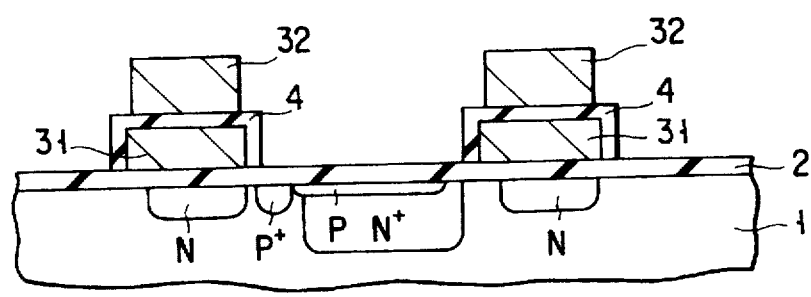
FIG. 6 is a sectional view of the stacked structure of the transfer gate electrode taken along line F6—F6 of FIG. 4.

FIG. 4 is a plan view of a solid-state imaging device having a CCD structure that performs an all-pixel reading operation by a four-phase driving scheme, according to a first embodiment of the present invention. FIG. 5 is a sectional view of the stacked structure of a transfer gate electrode taken along line F5—F5 of FIG. 4. FIG. 6 is a sectional view of the stacked structure of the transfer gate electrode taken along line F6—F6 of FIG. 4. In each of the figures, the transfer gate electrode for taking signal charges out of a photodiode PD and transferring them vertically is constructed as follows. At a gate insulating film 2 (silicon oxide film) on a silicon substrate 1, first-layer polysilicon electrodes 31 (31-1, 31-2), second-layer polysilicon electrodes 32 (32-1, 32-2) are each formed so as to have a specific gate length and be in contact with the gate insulating film. The electrodes 31, 32 are insulated from each other by an oxide film 4.

Specifically, at the gate insulating film 2 on the silicon substrate 1, the first-layer polysilicon electrode members (31) are provided in parallel with each other in such a manner that they sandwiches the photodiode PD between them in a plane and the second-layer polysilicon electrode members (32) not only are provided in parallel with each other on the first-layer polysilicon electrode members (31) via the insulating film 4 but also extend and adjoin so as to enclose the photodiode PD in a plane.

If four-phase transfer clocks are φ1 to φ4, the clocks will be applied to the electrodes 31, 32 repeatedly in this order: the second-layer electrode 32-1 (φ2)—the second-layer electrode 32-2 (φ3)—the first-layer electrode 31-2 (φ4)—the first-layer electrode 31-1 (φ1). Applying the clocks in this way causes the signal charges to be transferred in sequence (FIG. 5). With such a configuration, a CCD structure that performs an all-pixel reading operation by a four-phase driving scheme is realized using a two-layer structure for the transfer gate electrodes. As a result, the shading film deposited after the formation of interconnections has a better coverage in the step portions, which minimizes the occurrence of breaks in the step, thereby reducing the degradation of the smear characteristic remarkably.

FIGS. 7 to 13 are plan views illustrating a method of manufacturing the structure of FIG. 4 in order of step. FIGS. 14 to 24 are sectional views illustrating a method of manufacturing the important portion of the transfer gate electrode, taken along line F14—F14 of FIG. 4. Using these figures, the structure of the first embodiment will be explained.

Figure 7:
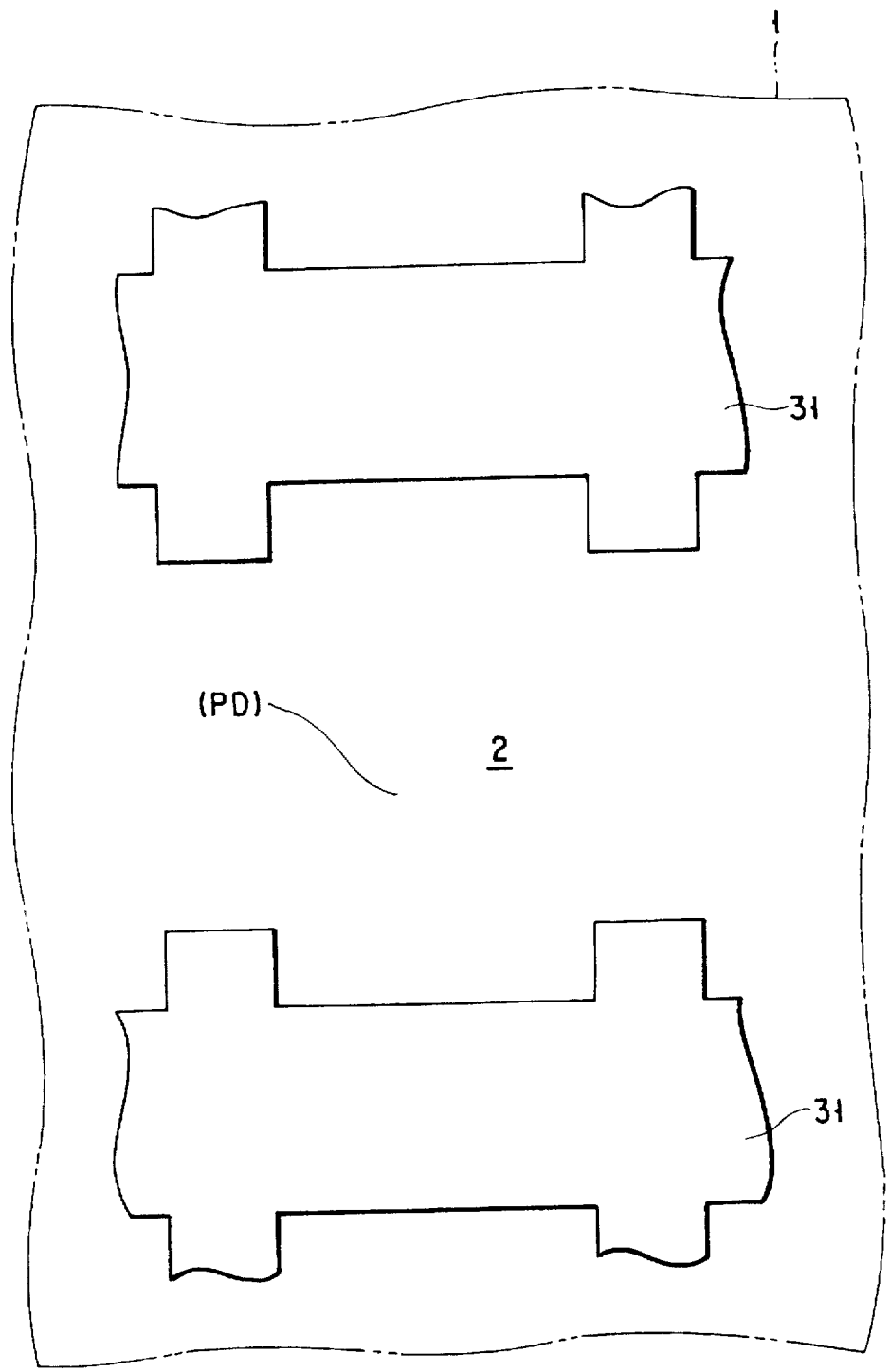
FIG. 7 is a first plan view illustrating a method of manufacturing the structure of FIG. 4 in order of step.

First, as shown in FIG. 7, a gate insulating film 2 is formed on a silicon substrate 1, a first-layer polysilicon electrode member (31) is deposited on the gate insulating film 2, and a photolithography step is carried out which removes the area (PD) in which a photodiode is to be formed and the area in which a second-layer polysilicon electrode member (32) is to be formed by anisotropic etching (FIG. 14). Numeral 101 in FIG. 14 indicates a photoresist.

Figure 8:
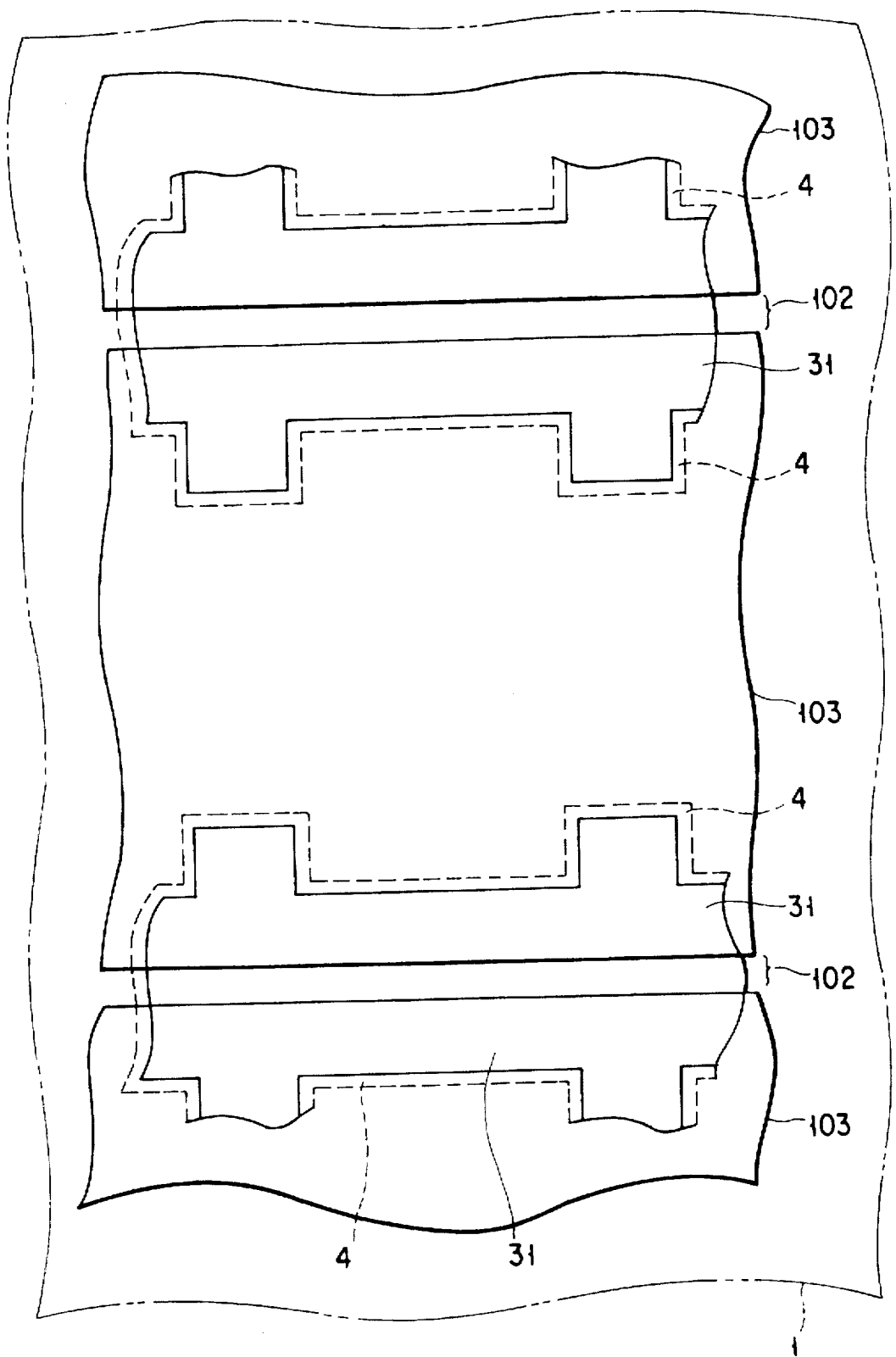
FIG. 8 is a second plan view following FIG. 7.
Figure 9:
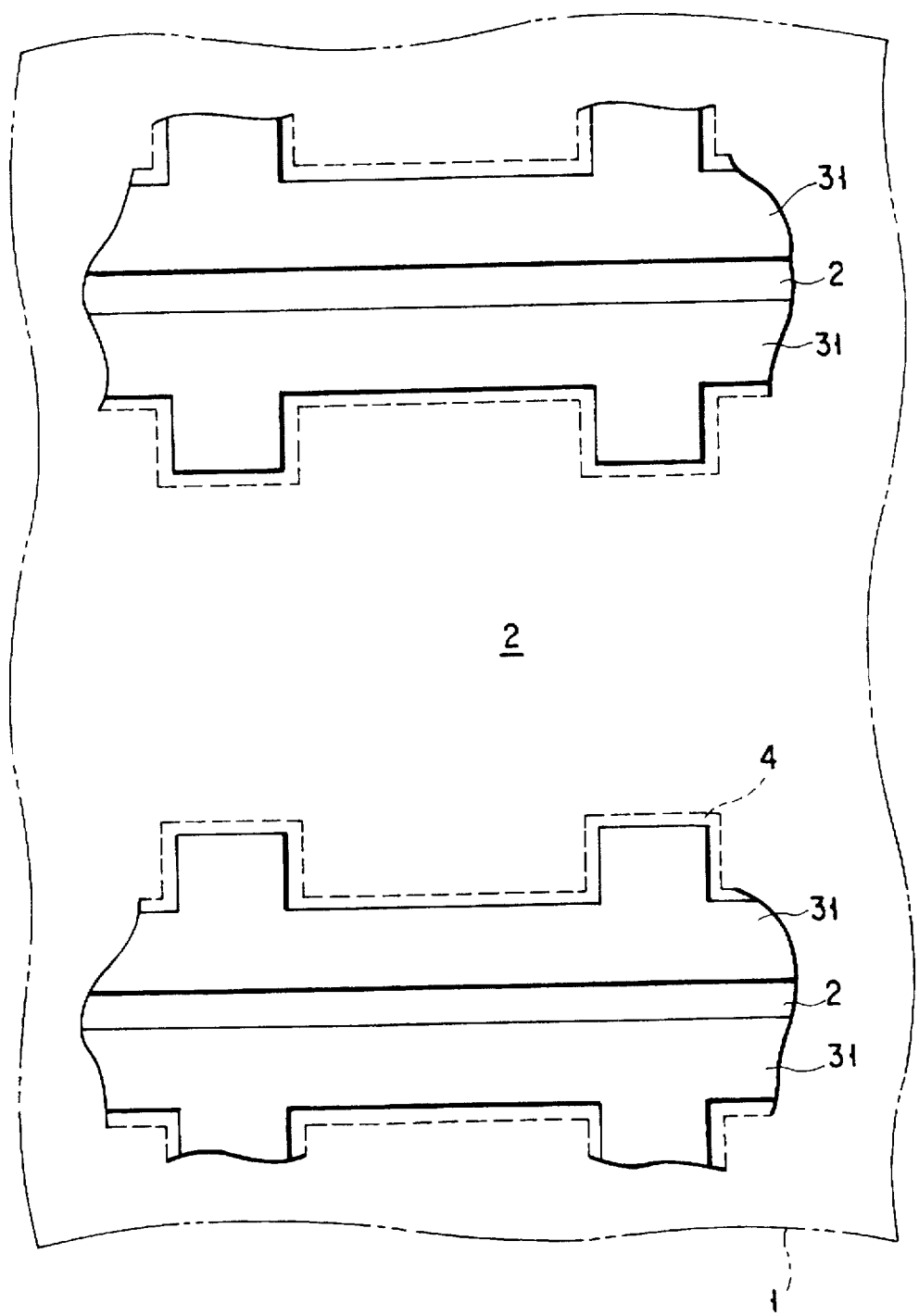
FIG. 9 is a third plan view following FIG. 8.

Next, as shown in FIG. 8, a silicon oxide film 4 covering the first-layer polysilicon electrode member (31) is formed by thermal oxidation or CVD (FIG. 15) and thereafter an opening pattern 102 with a pitch larger than 300 nm is formed using a photoresist 103 in a place where a gap is to be made to separate the first-layer polysilicon electrode member (31) to form a gate electrode. Then, the first-layer polysilicon electrode material (31) is cut off by anisotropic etching (FIG. 16). The anisotropic etching may be effected using the same photoresist 103 as that used in etching the oxide film 4 as a mask or using the oxide film 4 after removal of the photoresist 103 as a mask. In either case, the structure obtained after the photo-resist 103 has been remove looks as shown in FIG. 9.

Figure 10:
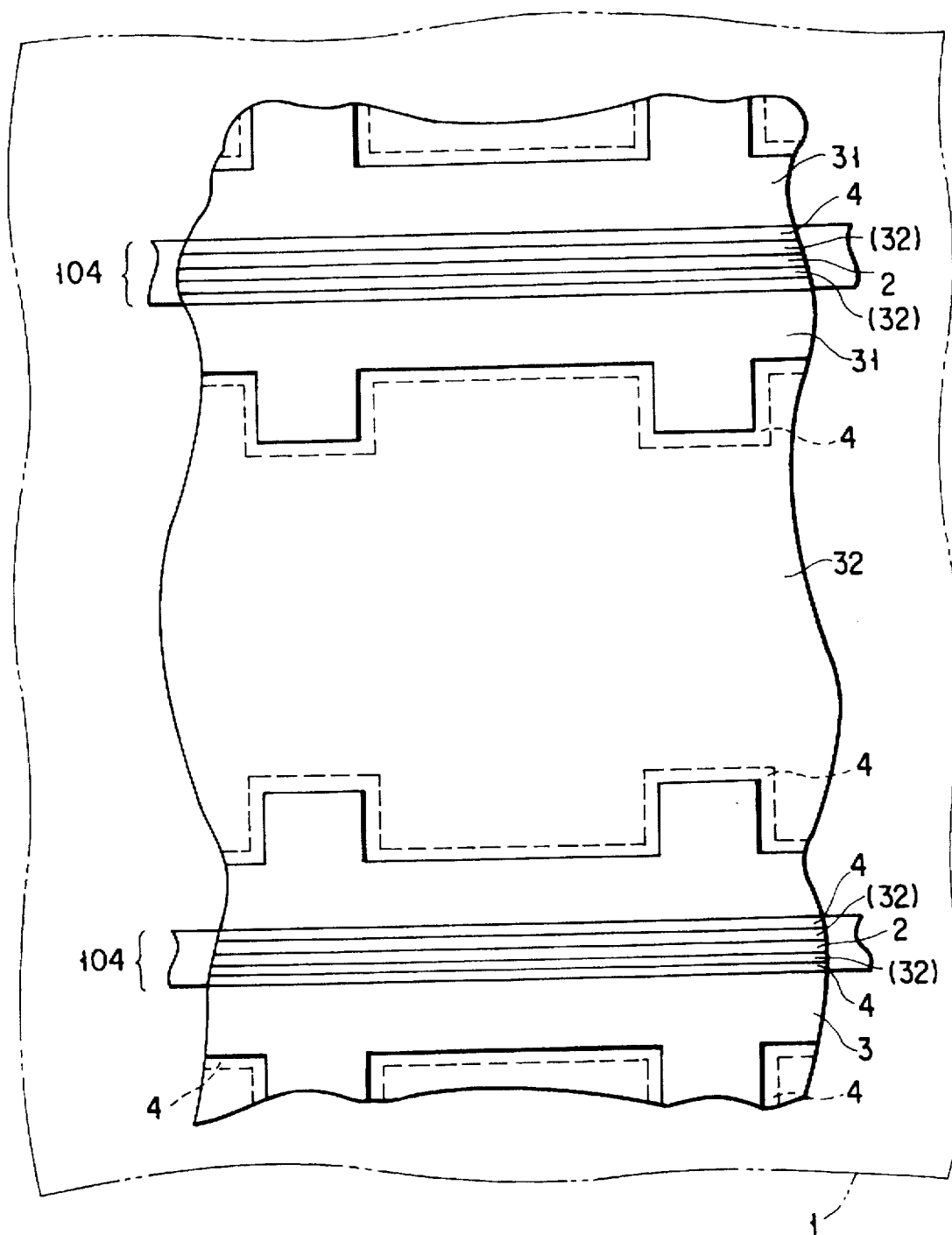
FIG. 10 is a fourth plan view following FIG. 9.

Next, as shown in FIG. 10, a second-layer polysilicon electrode member (32) is formed all over the surface. This fills the cut-off portions of the first-layer polysilicon electrode member (31) with the second-layer polysilicon electrode material. Thereafter, an opening pattern 104 greater than the opening pattern 102 is formed using a photoresist 105, centered on the cut-off portions (FIG. 17). Then, anisotropic etching is done so as to leave the second-layer polysilicon electrode member (32) exposed in the opening pattern 104 only on the sidewall of the cut-off end of the first-layer polysilicon electrode member (31). In the photolithography step, control is performed so that a gap for separating gate electrodes from the first-layer polysilicon electrode 31 may be smaller than 300 nm. FIG. 18 illustrates the structure with the photoresist 105 removed, in which the gap G of the gate electrode acting as the first-layer polysilicon electrode is smaller than 300 nm.

Figure 12:
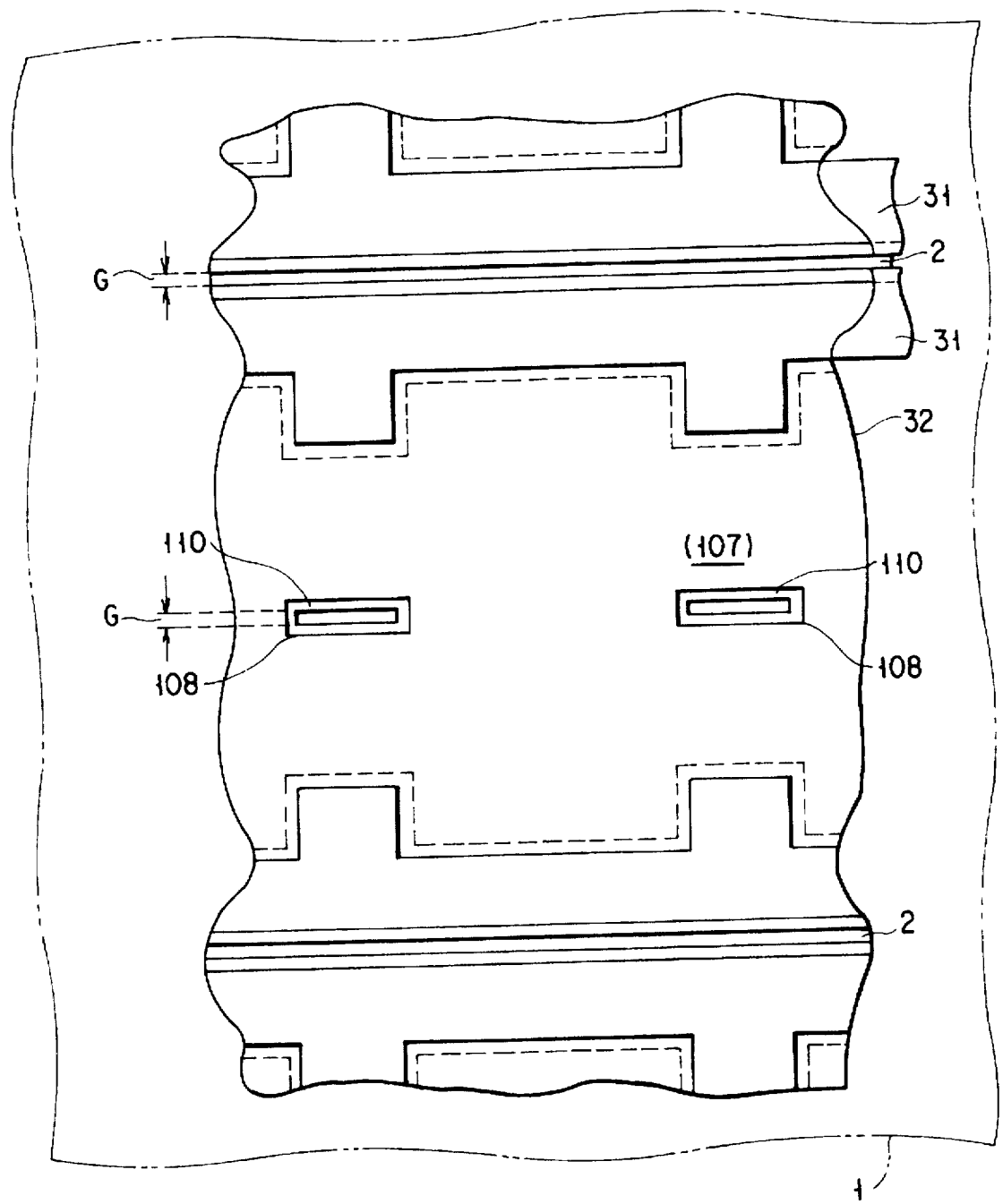
FIG. 12 is a sixth plan view following FIG. 11.
Figure 13:
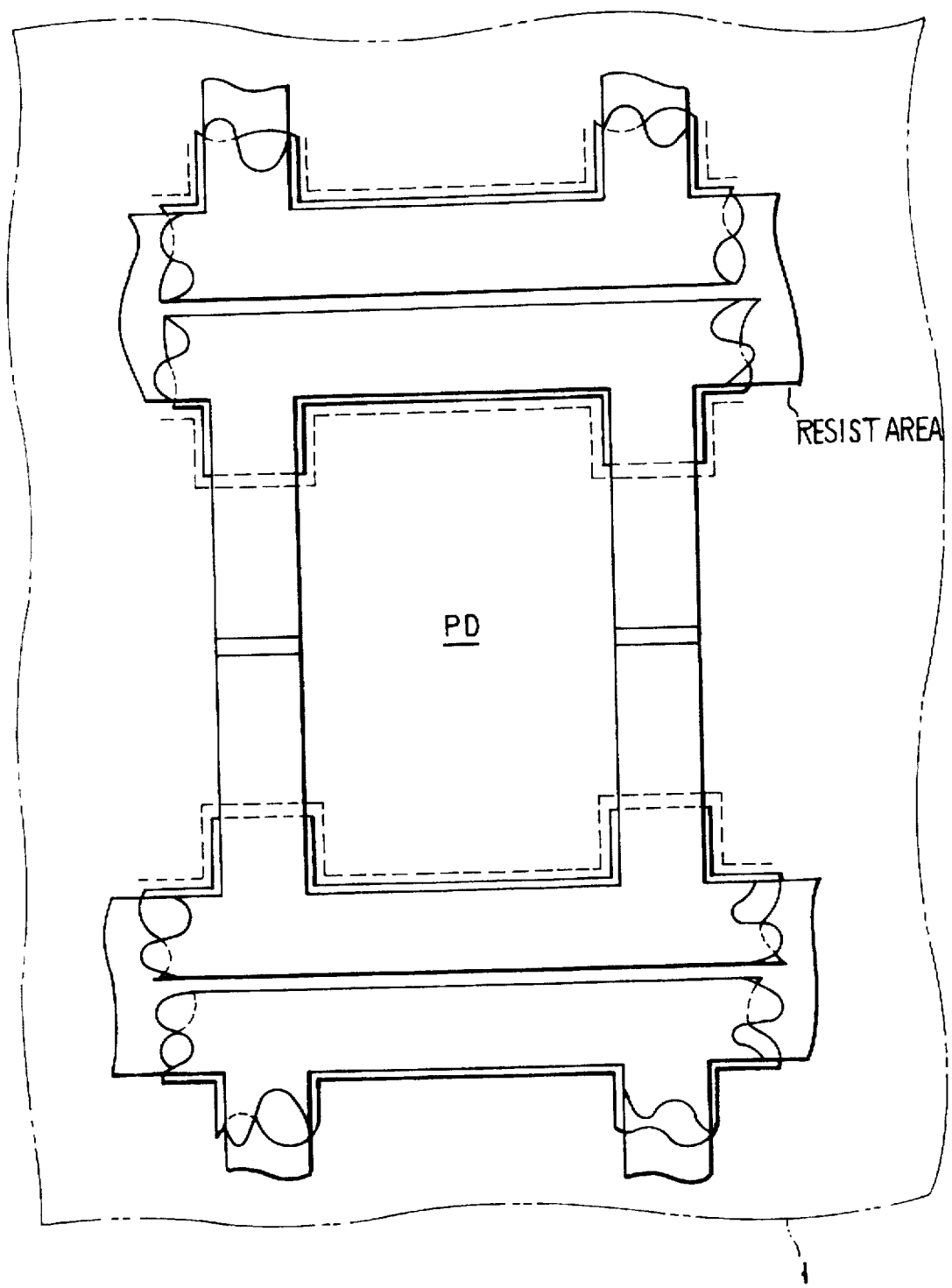
FIG. 13 is a seventh plan view following FIG. 12.

Next, as shown in FIG. 11, after an oxide film 106 has been formed on the surface of the second-layer polysilicon electrode member (32), a CVD film 107 (CVD oxide film) is deposited all over the surface (FIG. 19), an opening pattern 108 with a pitch larger than 300 nm is formed using a photoresist 109 in a place where a gap is to be formed to separate the second-layer polysilicon electrode material to form a gate electrode, and only the CVD film 107 and oxide film 106 exposed in the opening pattern 108 are removed by anisotropic etching, which allows a selection ratio for the second-layer polysilicon electrode member (32) (FIG. 20). Then, as shown in FIG. 12, the photoresist 109 is peeled and a CVD film 110 thinner than the CVD film 107 is deposited on the portion to be etched with the opening pattern 108 and on the CVD film 107 (FIG. 21). Thereafter, the anisotropic etching of the CVD film 110 leaves the CVD film 110 as a sidewall in the portion (i.e., the cross-section of the CVD film 110 and oxide film 106) to be etched with the opening pattern 108. The CVD film 110 and CVD film 107 make a mask for forming a gap G for separating the second-layer polysilicon electrode material (32) as gate electrodes (FIG. 22). Next, by effecting anisotropic etching with the CVD films 110, 117 as a mask, control is performed so that the gap G of the gate electrode at the second-layer polysilicon electrode 32 may be smaller than 300 nm (FIG. 23). Thereafter, as shown in FIG. 13, a photolithography step is carried out in such a manner that the substrate is exposed in the area of the photodiode PD, followed by the step of injecting a suitable amount of ions so that the exposed substrate may function as a photodiode PD, and then the photodiode and transfer gate electrodes are covered with a PSG film 111 and are subjected to reflow (FIG. 24). Thus, the structure as shown in FIG. 4 is produced.

With the method according to the present invention, the non-interlacing four-phase driving CCD structure of the IT-CCD can construct the transfer gate electrodes of a two-layer structure as in the interlacing scheme. This reduces the number of steps more than conventional three-layer structure, decreasing the manufacturing cost.

Figure 25:
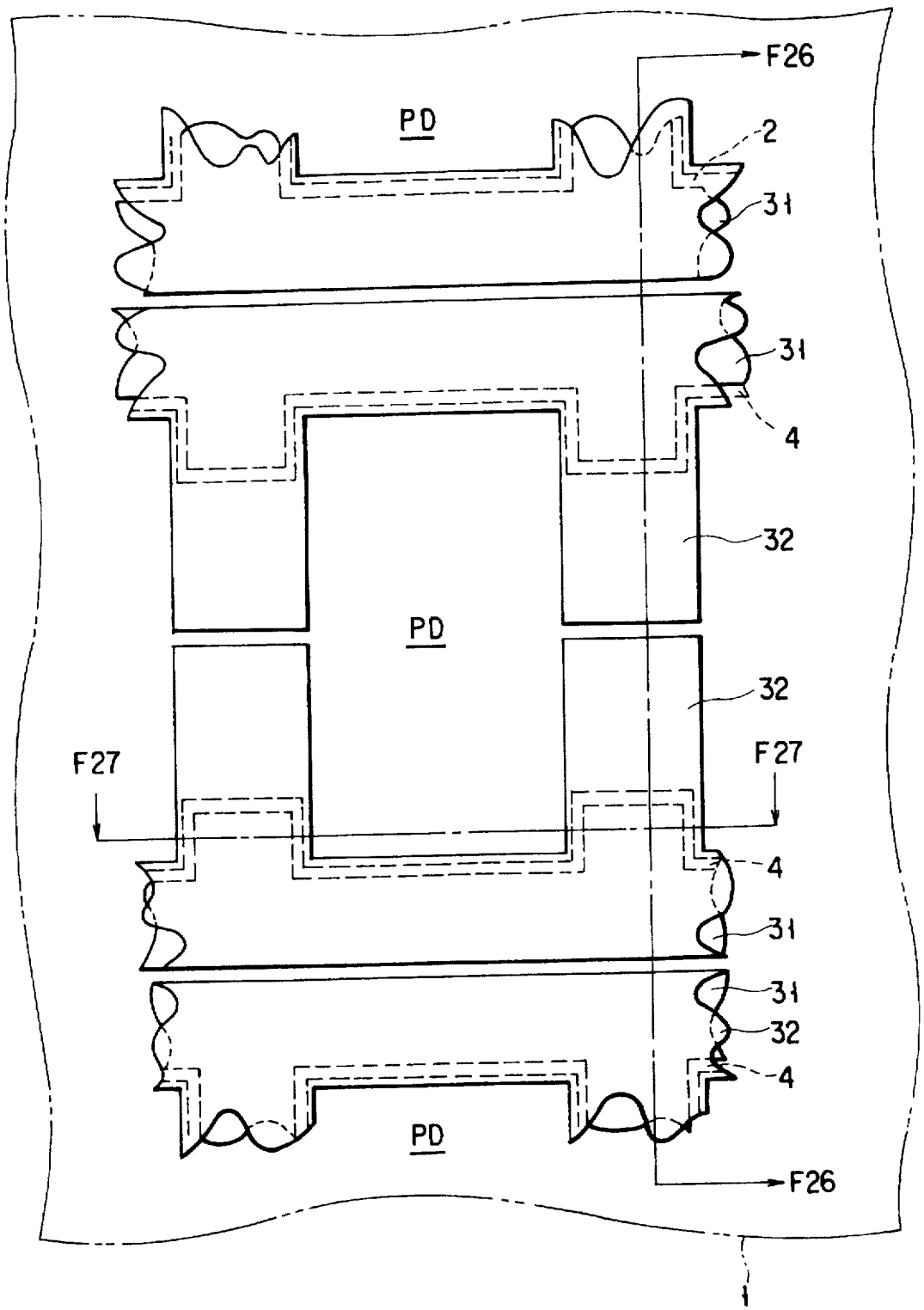
FIG. 25 is a plan view of a solid-state imaging device having a CCD structure that performs an all-pixel reading operation by a four-phase driving scheme, according to a second embodiment of the present invention.

FIG. 25 is a plan view of a solid-state imaging device having a CCD structure that performs an all-pixel reading operation by a four-phase driving scheme, according to a second embodiment of the present invention. FIG. 26 is a sectional view of the stacked structure of a transfer gate electrode taken along line F26—F26 of FIG. 25. FIG. 27 is a sectional view of the stacked structure of the transfer gate electrode taken along line F27—F27 of FIG. 25. In each of the figures, the second embodiment differs from the first embodiment in the structure of the second-layer polysilicon electrode members (32) acting as the transfer gate electrodes for taking the signal charges from the photodiode PD and transferring them vertically. Specifically, the second-layer polysilicon electrode members (32) not only are provided in parallel with each other on the first-layer polysilicon electrode members (31) via the oxide film 4 but also extend so as to enclose the photodiode PD in a plane in such a manner that they each cover the sidewall of the first-layer polysilicon electrode member on the opposite side. As in the first embodiment, if four-phase transfer clocks are φ1 to φ4, the clocks will be applied to the electrodes 31, 32 repeatedly in this order: the second-layer electrode 32-1 (φ2)—the second-layer electrode 32-2 (φ3)—the first-layer electrode 31-2 (φ4)—the first-layer electrode 31-1 (φ1). Applying the clocks in this way causes the signal charges to be transferred in sequence.

The second embodiment thus constructed achieves the method and steps as described in the first embodiment. In the photolithography step of exposing the substrate in the area of the photodiode PD shown in FIG. 13, however, the PD area is a little smaller than that in the first embodiment, but the margin of the accuracy of the photolithography step is greater.

The most important feature of the present invention is that it is a two-layer four-phase driving CCD solid-state imaging device and the transfer gate electrodes are constructed in such a manner that the first-layer electrode, the second-layer electrode, the second-layer electrode, and the first-layer electrode are repeated in that order. Therefore, the diffused-area cross section of the photodiode PD is not restricted to those shown in FIG. 6 and FIG. 27.

As described so far, with the present invention, by mixing the structure of polysilicon electrodes of the same layer with the structure of polysilicon electrodes of a different layer to form the transfer gates, the step height in interconnections is reduced without decreasing the interconnection density, which reduces the number of breaks in the steps of the shading film remarkably, improving the smear characteristic of the imaging device. Because the height of the interconnection layer on the substrate is decreased, the distance between a microlens and color filter arranged above the interconnection layer and the substrate in which the photodiode has been formed is made shorter. Accordingly, it is possible to provide a solid-state imaging device capable of preventing color shading and the deterioration of sensitivity and a manufacturing method thereof.

We claim:

1. A four-phase driving CCD-structure solid-state imaging device comprising:

a semiconductor substrate;

a first insulating film on said semiconductor substrate;

a first-layer electrode member on said insulating film;

a second-layer electrode member on said insulating film;

a second insulating film between said first-layer electrode member and said second-layer electrode member, wherein said CCD structure forms a vertical transfer gate electrode structure through a repetitive arrangement of said first-layer electrode member, said second-layer electrode member, said second-layer electrode member, and said first-layer electrode member in that order insulated from each other on said first insulating film.

2. A solid-state imaging device comprising:

a semiconductor substrate;

a light-receiving element constituting a pixel formed at said semiconductor substrate;

a gate insulating film on said semiconductor substrate; and transfer gate electrodes composed of first-layer electrode members and second-layer electrode members that each have a specific length and are each in contact with the surface of said gate insulating film to transfer the signal charges from said light-receiving element, wherein said first-layer electrode members are provided in parallel with each other so as to sandwich said light-receiving element in a plane between them, said second-layer electrode members are provided in parallel with each other on said first-layer electrodes via an insulating film and extend and adjoin so as to enclose said light-receiving element in a plane, said transfer gate electrodes are arranged so as to form a repetitive structure of the first-layer electrode, the second-layer electrode, the second-layer electrode, and the first-layer electrode in that order, and four-phase driving signals are supplied to the corresponding electrodes of the repetitive structure.

3. A solid-state imaging device comprising:

a semiconductor substrate;

a light-receiving element constituting a pixel formed at said semiconductor substrate;

a gate insulating film on said semiconductor substrate; and transfer gate electrodes composed of first-layer electrode members and second-layer electrode members that each have a specific length and are each in contact with the surface of said gate insulating film to transfer the signal charges from said light-receiving element, wherein said first-layer electrode members are provided in parallel with each other so as to sandwich said light-receiving element in a plane between them, said second-layer electrode members not only are provided in parallel with each other on said first-layer electrodes via an insulating film but also each cover the side face of said first-layer electrode member on the opposite side, extend and adjoin so as to enclose said light-receiving element in a plane, said transfer gate electrodes are arranged so as to form a repetitive structure of the first-layer electrode, the second-layer electrode, the second-layer electrode, and the first-layer electrode in that order, and four-phase driving signals are supplied to the corresponding electrodes of the repetitive structure.

4. An interline-transfer four-phase driving CCD solid-state imaging device for reading all pixels, comprising:

a semiconductor substrate;

a gate insulating film formed on said substrate with the pixel area on said substrate removed; and vertical transfer gates composed of a first and second interconnection members of a first layer formed in parallel between adjacent pixel areas in the vertical transfer direction on the surface of said gate insulating film and a third and fourth interconnection members of a second layer that not only are provided in parallel with each other on said first and second interconnection members via an insulating film but also extend on said gate insulating film around said pixel area, wherein said first to fourth interconnection members are supplied with the corresponding four-phase driving pulses to transfer the signal charges accumulated in said pixel area.

5. A solid-state imaging device according to claim 4, wherein the gap G between adjacent transfer gate electrodes of each of said first layer in said vertical transfer direction is smaller than 300 nm.

6. A solid-state imaging device according to claim 4, wherein the gap G between adjacent transfer gate electrodes of each of said second layer in said vertical transfer direction is smaller than 300 nm.

7. An interline-transfer four-phase driving CCD solid-state imaging device for reading all pixels, comprising:

a semiconductor substrate;

a gate insulating film formed on said substrate except for the pixel area on said substrate; and vertical transfer gates composed of a first and second interconnection members of a first layer formed in parallel between adjacent pixel areas in the vertical transfer direction on the surface of said gate insulating film and a third and fourth interconnection members of a second layer that not only are provided in parallel with each other on said first and second interconnection members via an insulating film but also extend on said gate insulating film around said pixel area in a manner that covers said first and second interconnection members, wherein said first to fourth interconnection members are supplied with the corresponding four-phase driving pulses to transfer the signal charges accumulated in said pixel area.

8. A solid-state imaging device according to claim 7, wherein the gap G between adjacent transfer gate electrodes of each of said first layer in said vertical transfer direction is smaller than 300 nm.

9. A solid-state image device according to claim 7, wherein the gap G between adjacent transfer gate electrodes of each of said second layer in said vertical transfer direction is smaller than 300 nm.

* * * * *